United States Patent
Laureanti (10) Patent No.: US 6,541,993 B2
(45) Date of Patent: Apr. 1, 2003

(54) TRANSISTOR DEVICE TESTING EMPLOYING VIRTUAL DEVICE FIXTURING

(75) Inventor: Steven J. Laureanti, Lewisville, TX (US)

(73) Assignee: Ericsson, Inc., Richardson, TX (US)

(*) Notice: Subject to any disclaimer, the term of this patent is extended or adjusted under 35 U.S.C. 154(b) by 64 days.

(21) Appl. No.: 09/749,027

(22) Filed: Dec. 26, 2000

(65) Prior Publication Data

US 2002/0118034 A1 Aug. 29, 2002

(51) Int. Cl.$^7$ .............................................. G01R 31/26

(52) U.S. Cl. ....................... 324/765; 324/768; 324/769

(58) Field of Search ................................ 324/765, 768, 324/769, 719, 600, 638, 646, 650; 702/108, 109

(56) References Cited

U.S. PATENT DOCUMENTS 5,191,294 A * 3/1993 Grace et al. ................. 324/613
6,397,160 B1 * 5/2002 Craig et al. .................. 324/142

* cited by examiner

Primary Examiner—Kamand Cuneo
Assistant Examiner—Russell M. Kobert (57) ABSTRACT

Virtual device fixturing is used to test transistor products, such as LDMOS power amplifier products, in the final packaging and testing stage of device fabrication. The input and output impedance transformation networks of a typical test fixture are implemented in software. The impedance matching function, normally performed by the physical input and output impedance transformation networks of the fixture, is supplanted by de-embedded scatter parameter calibration files. Test equipment, such as a vector network analyzer, attaches to a universal test fixture, while the software scatter parameter components are responsible for making the calibrations necessary to present the device under test with a matching low impedance.

18 Claims, 7 Drawing Sheets

```
! 2 port S-parameter file
! Input S-parameter Block
! Product WCDMA 35 Watt Device; Package XX.X
! Date/time 11/15/00 17:50:02
# GHZ S MA R 50
! Scattering Parameters
!Freq          S11              S21             S12             S22
2.1100 0.95743 -41.975  2.70559 140.154 0.05758 57.596 0.61681  -29.861
2.1400 0.92692 -57.503  2.53931 124.511 0.06095 47.130 0.60616  -43.491
2.1700 0.89699 -72.576  2.38381 109.240 0.06422 37.263 0.59717  -56.680
4.2200 0.86764 -87.194  2.23909  94.343 0.06739 27.995 0.58984  -69.427
4.2800 0.83887 -101.358 2.10515  79.818 0.07046 19.328 0.58417  -81.732
4.3400 0.81068 -115.068 1.98199  65.665 0.07343 11.261 0.58016  -93.595
6.3300 0.78307 -128.322 1.86961  51.885 0.07630  3.793 0.57781 -105.017
6.4200 0.75604 -141.123 1.76801  38.478 0.07907 -3.075 0.57712 -115.996
6.5100 0.72959 -153.469 1.67719  25.443 0.08174 -9.343 0.57809 -126.535
```

FIG. 6

INPUT REFLECTION COEFFICIENT freq (2.110GHz to 6.510GHz)

FIG. 7A

OUTPUT REFLECTION COEFFICIENT freq (2.110GHz to 6.510GHz)

TRANSISTOR DEVICE TESTING EMPLOYING VIRTUAL DEVICE FIXTURING

RELATED APPLICATION DATA

This application is related to co-pending application Ser. No. 09/745,752, filed Dec. 22, 2000, now pending, which is fully incorporated by reference herein.

FIELD OF THE INVENTION

The field of the present invention relates generally to testing transistor devices and, more specifically, to methods and apparatus employing "virtual" impedance fixturing for testing transistor devices.

BACKGROUND

Figure 1:
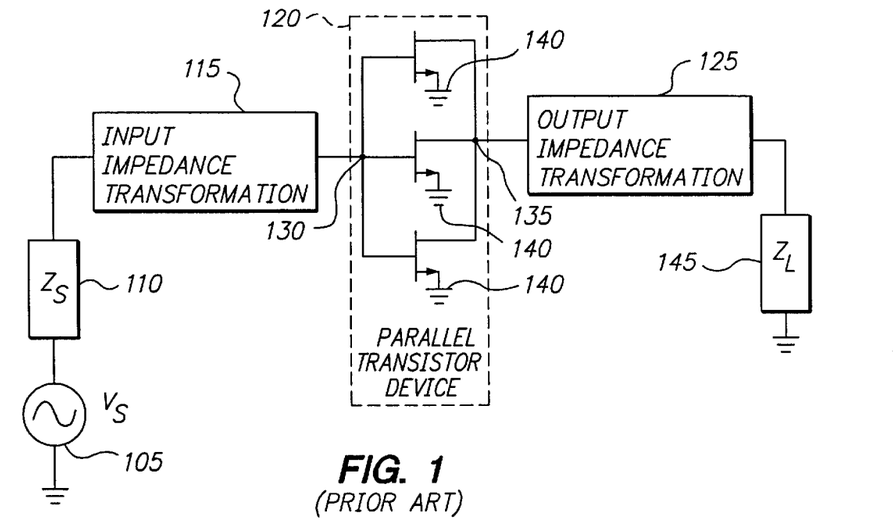
FIG. 1 is a circuit diagram of a power amplifier incorporating a parallel transistor device, as adopted from Gonzalez, Guillermo, *Microwave Transistor Amplifiers Analysis and Design,* Second Edition, Prentice Hall, 1997, p. 364.
Figure 2:
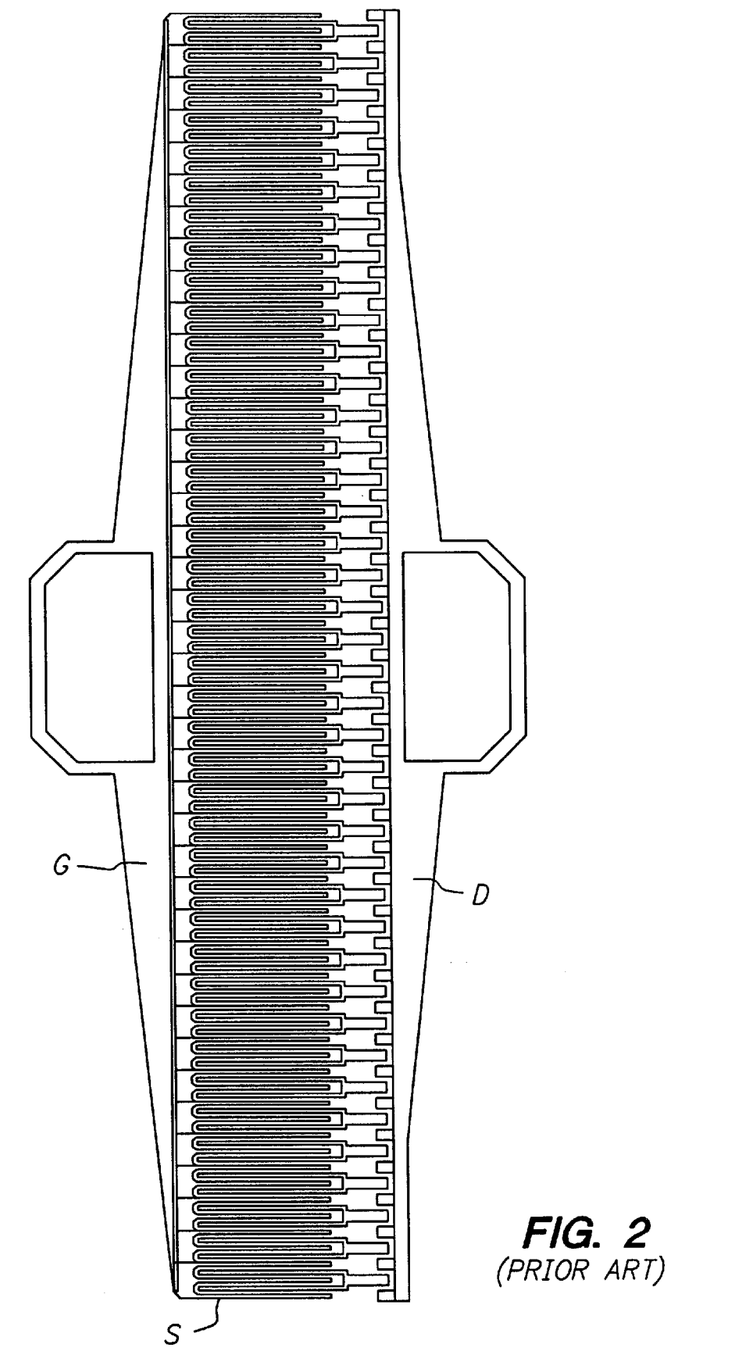
FIG. 2 is an enlarged view of an exemplary power amplifier device, illustrating an interleaved transistor construction.

A typical radio frequency (RF) power amplifier is constructed by paralleling several transistors together to achieve higher output power than is possible from a single transistor. FIG. 1 depicts a power amplifier circuit using parallel transistors, as adapted from Gonzalez, Guillermo, *Microwave Transistor Amplifiers Analysis and Design,* Second Edition, Prentice Hall, 1997, p. 364. A signal source $V_S$ 105 with source impedance $Z_S$ 110 is connected to the parallel transistor device input 130 through an input impedance transformation network 115. Similarly, a load impedance $Z_L$ 145 is coupled to the parallel transistor device output 135 via an output impedance transformation network 125. The gates of each transistor in the parallel transistor device are coupled together in a single input node 130. Similarly, the drains of each transistor are coupled together to form a single output node 135. Finally, the source of each transistor is coupled directly to ground 140. An enlarged physical representation of a typical parallel transistor construction at the device level is depicted in FIG. 2, wherein the parallel transistors comprise a series of interleaved fingers that are formed in an interlocking configuration.

Figure 3:
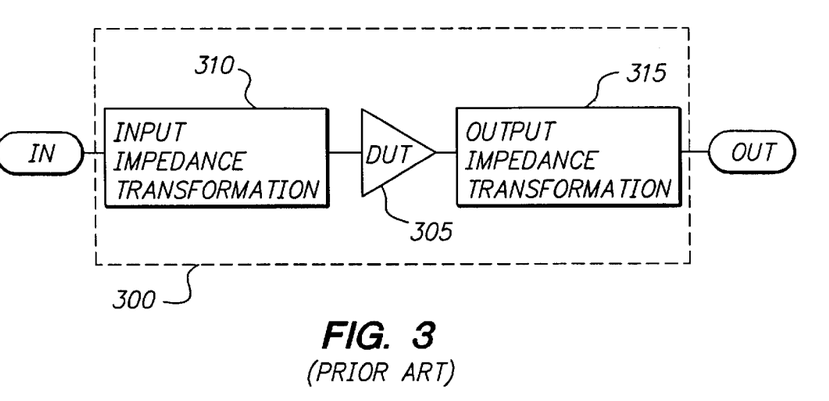
FIG. 3 is a block diagram of a typical test figure used by automated testing equipment (ATE) to test a packaged power amplifier product.

The methods employed to test a packaged power amplifier generally require that the power amplifier be mounted to a test fixture. FIG. 3 represents a block diagram of a typical test fixture 300 used to house a device under test ("DUT") 305, while the DUT 305 undergoes testing by automated testing equipment (ATE). The DUT 305 is coupled at its input terminal by an input impedance transformation (or "matching") network 310. Similarly, the DUT is coupled at its output terminal by an output matching network 315. The input and output matching networks 310 and 315 are often implemented using microstrip technology. However, many other designs for reducing the imaginary components of capacitance and inductance may be employed, including on-board discrete components like capacitors and inductors.

The inverse relationship between an extremely high power gain realizable by RF power amplifiers and the correspondingly low impedance levels required in order to achieve this gain is in large part responsible for the drawbacks from which the test fixture of FIG. 3 suffers. For example, extremely low impedance devices make testing difficult. Modem automated testing equipment is designed on an impedance matching standard of 50 ohms, meaning that the input and output matching networks 310 and 315 of FIG. 3 must match the input and output impedances of the DUT 305 to the 50-ohm impedance level of the test equipment. The input and output impedances of a typical packaged RF amplifier nominally ranges between one-half ohm and five ohms. Thus, testing power amplifier devices is troublesome largely due to the impedance transformation required to step the 50-ohm test equipment impedance down to the single-digit impedance level of the device. Further, the input and output matching networks 310 and 315 are application specific, requiring a separate and distinct test fixture for each type of device. Because the matching networks 310 and 315 of FIG. 3 are physical components of the ATE, application independence also requires separate ATE for each device type.

Notably, in a high capacity manufacturing environment where multiple test stations are often employed, fixture cross-correlation must be maintained within tolerances to ensure that a device tested at one ATE station will produce the same results that the same device, or a nearly identical device, would produce if it were tested at a different ATE station. This maintenance of fixture cross-correlation is time consuming, inexact, and highly error-prone. Furthermore, modifications to microstrip impedance matching networks often involve an imprecise manipulation of board-level components, contributing to even greater fixture cross-correlation miscalibration.

SUMMARY OF THE INVENTION

The present invention is directed to "virtual" fixturing of a device being tested, the virtual fixturing being implemented by "de-embedding" the input and output matching networks of a physical test fixture.

In accordance with one aspect of the invention, a method for testing a transistor device is provided, comprising measuring small signal scatter parameters of the device, measuring a performance characteristic of the device, and transforming the measured performance characteristic based on the measured small signal scatter parameters of the device.

In accordance with another aspect of the invention, a system is provided for testing a transistor device, such as a laterally diffused metal oxide semiconductor (LDMOS) power transistor package. In a preferred embodiment, the system includes a test station having an input for coupling to a input terminal and an output for coupling to an output terminal, respectively, of the device, a network analyzer coupled to the test station for measuring small signal scatter parameters and for measuring a performance characteristic of the device, and a processor coupled to the network analyzer, the processor configured for transforming the measured performance characteristic based on the measured small signal scatter parameters.

An advantage of the invention is that a universal test fixture may be used for multiple types of devices to be tested, without having to change out the impedance matching networks at both ends of the device. Having a universal test fixture for multiple device applications eliminates errors associated with inter-fixture calibration from testing station to testing station within the manufacturing environment. Calibration of the virtual device fixture is performed in software and is consequently less cumbersome than the making board-level modifications otherwise required for impedance calibrations when preparing a test fixture for product testing.

Other and further aspects and advantages of the present invention will become apparent from the following detailed description and accompanying drawings.

BRIEF DESCRIPTION OF THE DRAWINGS

In the figures of the accompanying drawings, like reference numbers correspond to like elements, in which.

DETAILED DESCRIPTION

Figure 4:
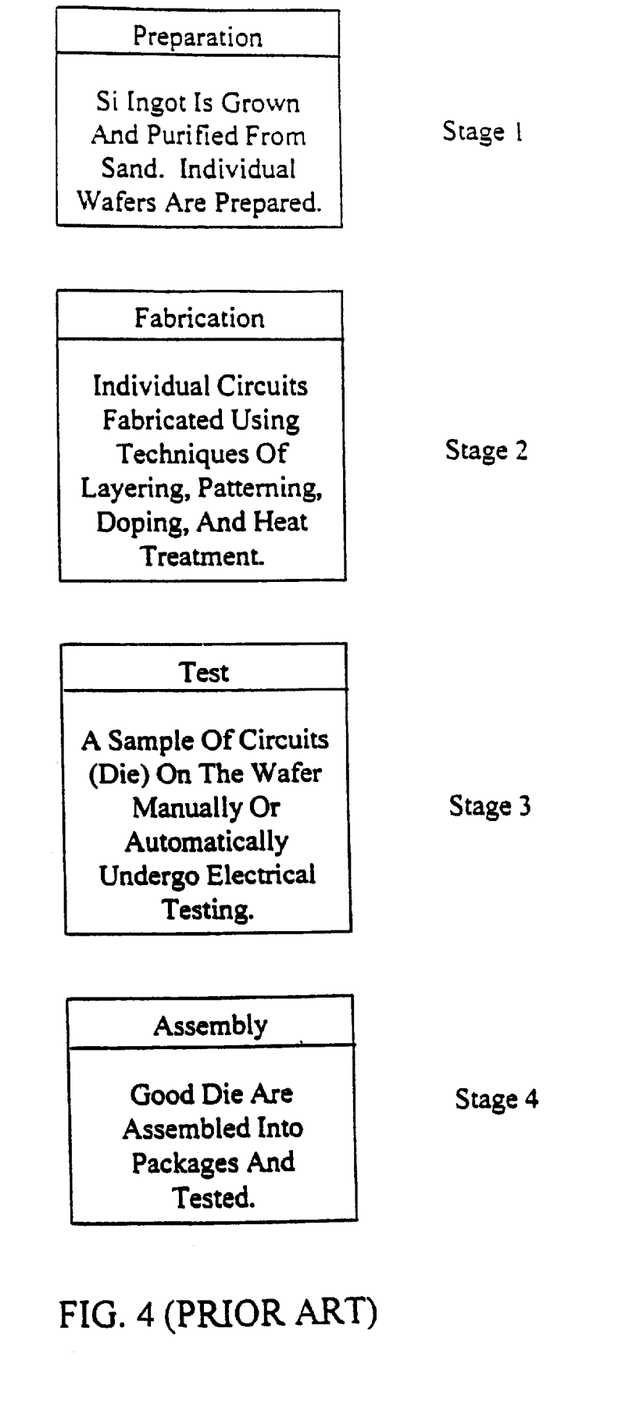
FIG. 4 is a simplified functional diagram representing the four stages of the semiconductor microchip fabrication process adapted from Van Zant, Peter, *Microchip Fabrication, A Practical Guide to Semiconductor Processing,* Fourth Edition, McGraw Hill, 2000, p. 85.

As shown in FIG. 4, microchip device fabrication is commonly thought to take place in a series of four stages, as adapted from Van Zant, Peter, *Microchip Fabrication, A Practical Guide to Semiconductor Processing,* Fourth Edition, McGraw Hill, 2000, p. 85. Stage 1 is the preparation stage where a crystalline silicon ingot is grown and purified from sand. It is here that individual wafers are prepared and "sliced" from the ingot. Stage 2 is the fabrication, or device fabrication stage. Layering, patterning, doping, and heat treatment are among the technologies employed during this stage to create the chips, called die, that become the electronic components in the final packaged product.

In the fabrication stage, stage 3, precision electrical testing of individual die is performed. This stage is sometimes called the wafer sort stage because bad die are sorted from good die based on the results of the electrical tests. In the assembly stage, stage 4, the die are packaged and tested before being placed into production as live electronic components. Packaging takes many forms but in every case the package chosen helps to protect the product from the harsh operating environment in which the product will operate.

A transistor device may undergo a host of final tests prior to leaving fabrication. Stress tests, burn-in, temperature treatment, and possibly other tests are often employed during different stages of the fabrication process or during prototyping. It is generally not feasible in a production environment to subject every product to the full battery of tests. By way of example, in the case of laterally diffused metal oxide semiconductor (LDMOS) power transistor devices used in RF power amplifier packages, crucial performance criteria to be tested include DC and RF performance characteristics, which are typically measured during the final packaging and testing stage of the amplifier. Together, DC and RF performance test measurements provide a complete characterization of a product making them useful in passing meaningful quality control judgment on a product before allowing the product to enter the market.

Figure 5:
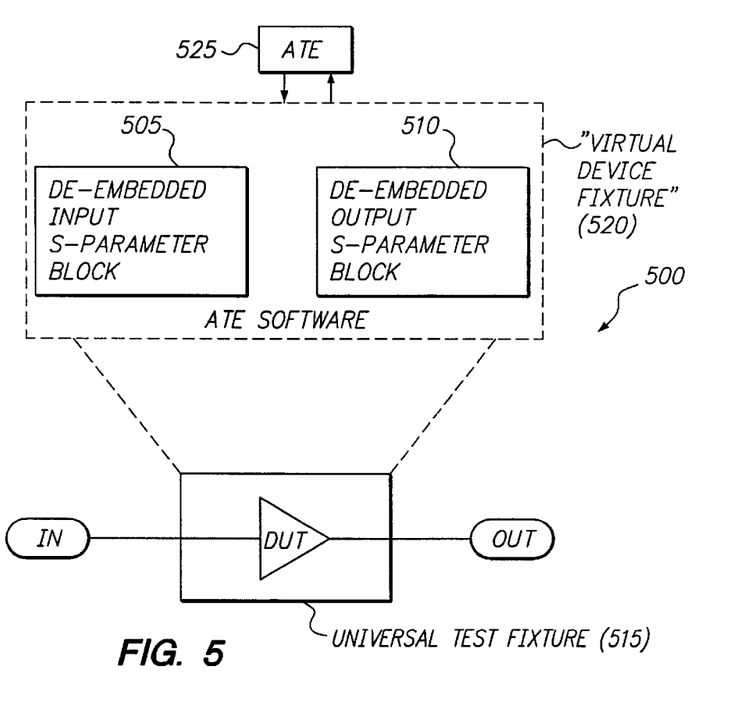
FIG. 5 is a schematic block diagram of a preferred system for virtual fixturing of laterally diffused metal oxide semiconductor ("LDMOS") power transistor devices, according to one aspect of the present invention.

FIG. 5 is a block diagram of a system 500 for virtual LDMOS device fixturing, in accordance with a general embodiment of the invention. Automated test equipment 525 interfaces with a universal test fixture 515 through ATE software 520. The input and output impedance matching networks 310 and 315 of FIG. 3 are supplanted in system 500 by the de-embedded input scatter parameter ("S parameter") blocks 505 and 510. In particular, the input S parameter block 505 and the output S parameter block 510 are "virtual" impedance transformation networks de-embedded (i.e., implemented) in ATE software.

Conceptually, the system 500 has both a virtual component 515 and a physical component 520. For example, some vestiges of the input and output matching network blocks of FIG. 3 must remain as part of system 500 in order to secure the physical connections between the testing equipment and the test fixture. Whereas the input matching block 310 of FIG. 3 performed the dual function of both impedance matching a test probe connectivity, the micro-strip implementation of the ATE test fixture of system 500 serves only to secure a test probe to the fixture, the impedance matching function having been de-embedded. A similar statement can be made regarding the output connectivity of the test fixture of system 500.

In particular, the input and output matching networks 310 and 315 of the prior art test fixtures are substituted with input S parameter block 505 and S parameter output block 510 by employing a mathematical transformation that maps the input reflection coefficient $S_{11}$ to its input impedance equivalent, and likewise maps the output reflection coefficient $S_{22}$ to its output impedance equivalent. The conversion is given by the relationship:

$$Z_{11} = \frac{Z_o(1+S_{11})(1-S_{22})+S_{12}S_{21}}{(1-S_{11})(1-S_{22})-S_{12}S_{21}}$$

and, $$Z_{22} = \frac{Z_o(1-S_{11})(1+S_{22})+S_{12}S_{21}}{(1-S_{11})(1-S_{22})-S_{12}S_{21}}$$

where the output and input impedance coefficients are defined as:

$$Z_{11} = \left.\frac{v_1}{i_1}\right|_{i_2=0} \quad \text{input impendance coefficient with output an ac open circuit}$$

$$Z_{22} = \left.\frac{v_2}{i_2}\right|_{i_1=0} \quad \text{output impendance coefficient with output an ac open circuit}$$

in the system $v_1 = Z_{11}i_1 + Z_{12}i_2$ $v_1 = Z_{21}i_1 + Z_{22}i_2$

This relationship between the S and Z parameters permits the S parameter input and output blocks of system 500 to "proxy" the input and output impedance matching networks 310 and 315 of FIG. 3. In effect, the input and output S parameter blocks exemplify a software or "virtual" transformation. The particular de-embedded S parameter blocks integral to virtual device fixturing are fundamental byproducts of power amplifier design. In other words, a design engineer develops the S parameter block components that the test engineer uses during final product testing to present each device with an accurately engineered and calibrated virtual Z transform.

The modularity of the S parameter blocks allows a test engineer to easily swap blocks between fabrication runs. In addition, the design engineer may make incremental alterations to the test equipment merely by selecting another S parameter modular block. Indeed, for design engineer and test engineer alike, the benefits of the virtual Z transform functionality of the S parameter modular blocks quite nearly eliminate the need to make hardware adjustments altogether.

Figure 6:
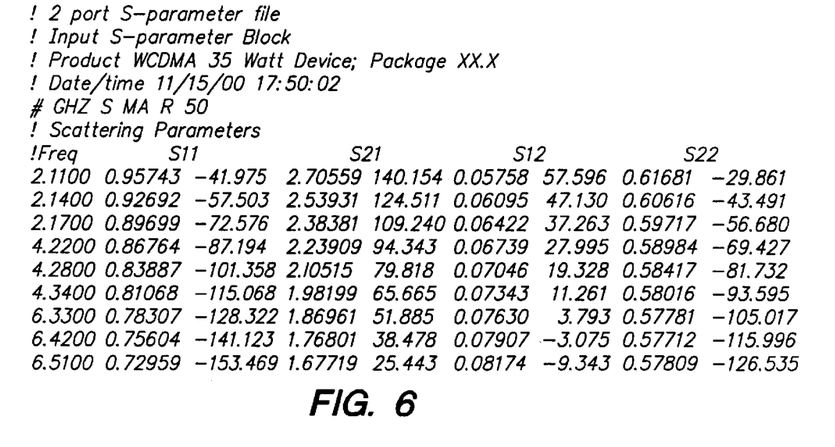
FIG. 6 represents a sample output of a typical frequency-dependent two-port scatter parameter file with scatter parameters revealed in polar form (magnitude and phase angle) for LDMOS devices.

By way of illustration, preferred methods and apparatus for virtual device fixturing of LDMOS devices makes use of two-part scatter parameter (S parameter) output files commonly associated with modem ATE equipment. The standard three-character extension referencing a two-part S parameter file is "*.S2P." The contents of a typical scatter parameter file are revealed in FIG. 6 over a sample spectrum of frequency ranging from a fundamental frequency of 2.11 to 2.17 GHz and the associated second and third harmonic frequencies of 4.22 to 4.34 GHz and 6.33 to 6.51 GHz, respectively.

Figure 7A:
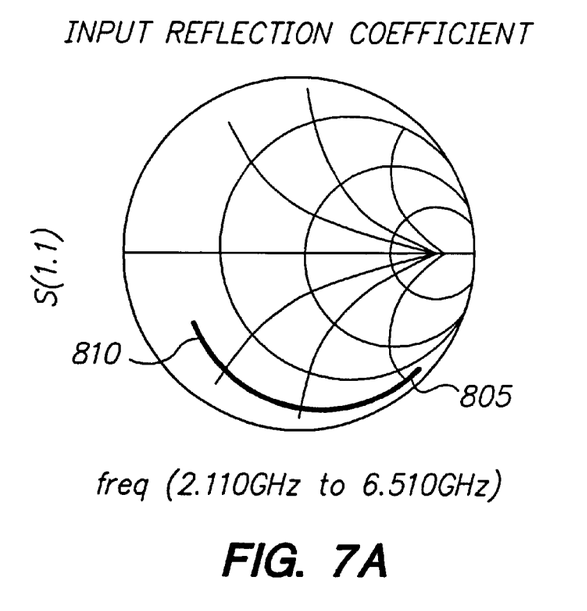
FIG. 7 represents a sample output of the input and output reflection coefficients from the frequency-dependent two-port scatter parameter file of FIG. 6, graphically depicted on a pair of Smith charts.
Figure 7B:
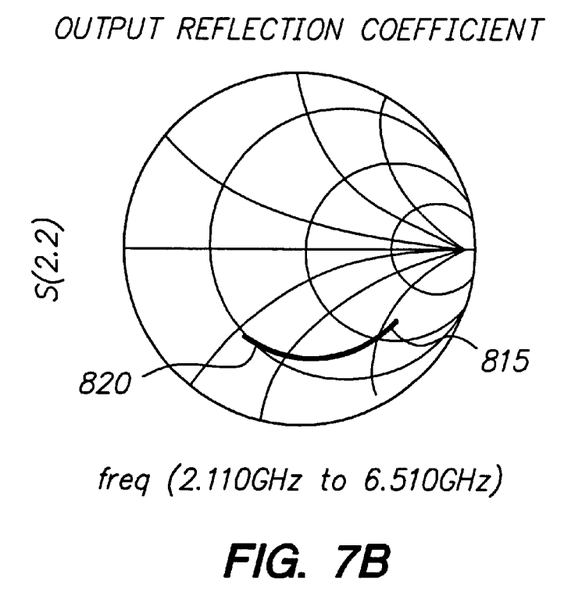

The input reflectivity coefficients over this range of frequencies pass (in polar notation) from 0.96|–42.0 to 0.73|–153.5 while the output reflectivity coefficients pass in value from 0.62|–29.9 to 0.58|–126.5. Smith charts (convenient for graphically visualizing the frequency-dependent nature of scatter parameters) are provided in FIG. 7. End-point 805 of the input reflection coefficient smith chart corresponds with the first polar coordinate (0.96|–42.0). The interpolated trace of input reflectivity values terminates at end-point 810 with polar coordinate 0.73|–153.5. A similar analysis derives the interpolated trace of the output reflection coefficient beginning with end-point 815 (0.62|–29.9) and terminating with end-point 815 (0.58|–126.0).

The two-port S parameter file is produced at design-time by the design engineer and later delivered to the test engineer along with specific instruction as to how and when the two-port S parameter file ought to be invoked, and for which device type. Apart from this, the test engineer need not know, or even be aware of the specific contents of an S parameter file, as setting tolerances is normally a domain of the designer, who ensures that the all performance criteria are accurately reflected in the two-port S parameter file, allowing for greater uniformity across ATE stations.

The measured and interpolated set of S parameters, together with the aforementioned S-to-Z transformation, form the basis for the virtual device fixturing. While a product endures testing across a range of operating test signal frequencies, the two-port S parameter file ensures that the device is presented with the precise $S_{11}$ parameter (if testing input) or $S_{22}$ parameter (if testing output) as derived during design.

Figure 8:
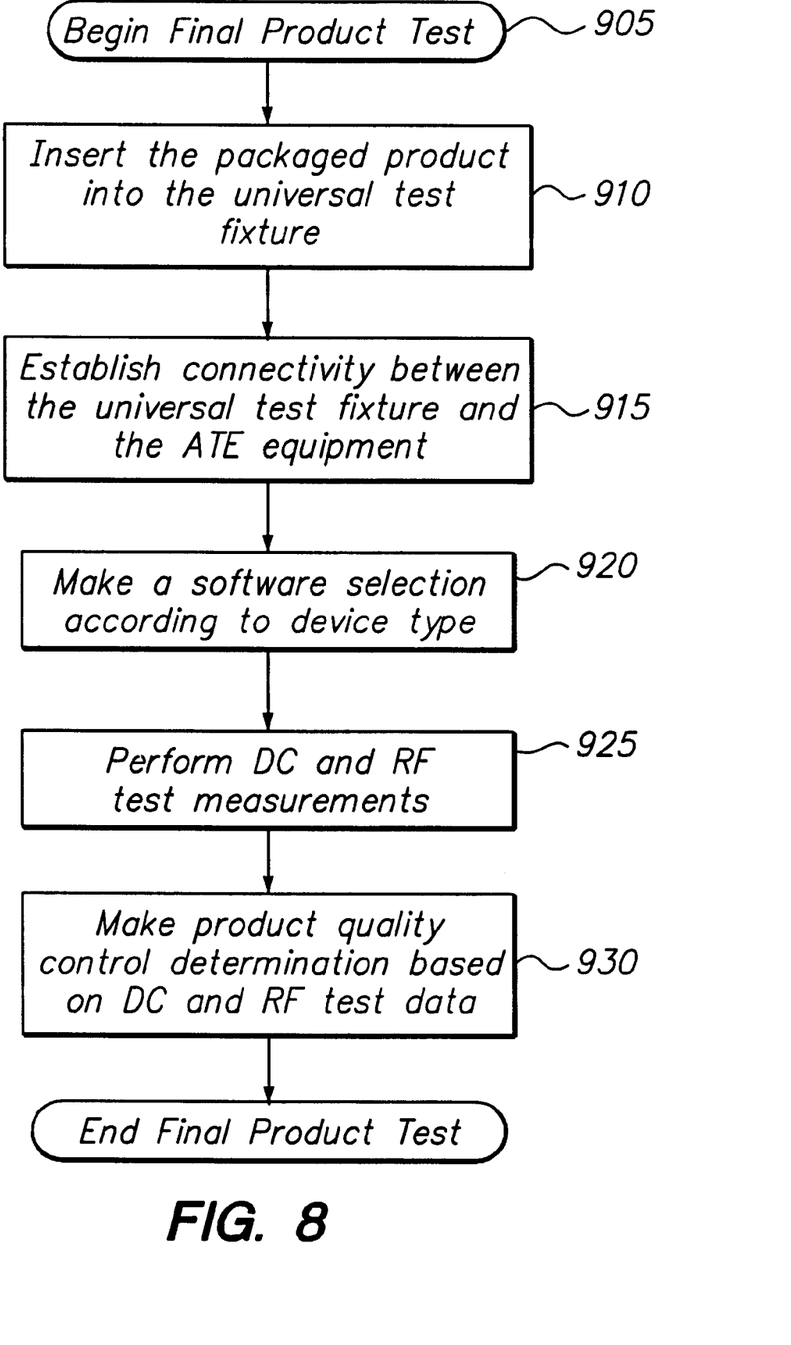
FIG. 8 is a flow diagram of a preferred method for LDMOS device testing employing virtual fixturing.

A preferred method for virtual fixturing of a laterally diffused metal oxide semiconductor (LDMOS) power amplifier package is diagramed in FIG. 8. In step 905, the method begins by first receiving an assembled, packaged device from a previous manufacturing stage. The device is called a product at this stage to differentiate it from its prior existence as a naked die, and to make clear that a product must be packaged prior to insertion into the universal test fixture. In step 910 the product is inserted into the universal test fixture.

A principle advantage to the method of and apparatus of FIG. 8 is the universality of the test fixture. A single fixture can be used to mount and test each different device type. For instance, a product from a 3-cell power amplifier fabrication run could be mounted and tested using the same test fixture used to later mount and test a 5-cell power amplifier from a separate manufacturing run. A separate physical ATE fixture is no longer required in order to support application specificity. The input and output de-embedded S parameter networks that replace the input impedance transformation block and the output impedance transformation block respectively, for a given test fixture, remain application specific; yet, by virtue of being software de-embedded, the networks are much more easily configured, stored, and modified. In other words, even though the virtual device fixture must still be tailored to a specific device type, doing so is handled with great ease by the ATE software.

Figure 9:
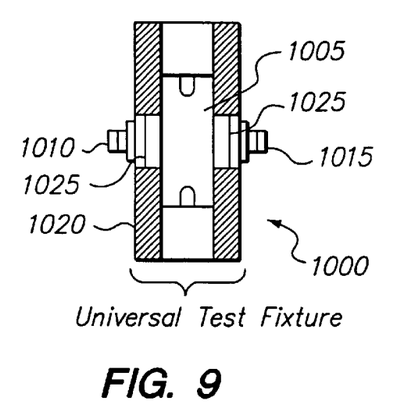
FIG. 9 is a diagram showing a physical representation of a preferred universal test fixture for LDMOS device testing employing virtual fixturing.

FIG. 9 is a diagram showing a device under test 1005 mounted onto a universal test fixture 1000. Every ATE test station is supplied with a single universal test fixture 1000. In one embodiment, the universal test fixture is part of the ATE apparatus. In other embodiments, the universal test fixture is cabled to the ATE equipment via an input connector 1010 and an output connector 1015. In one embodiment the input and output connectors are threaded female coaxial connectors for electrically coupling the universal test fixture to the ATE with coaxial cable.

The device under test (DUT) is clamped or otherwise fixed to the universal test fixture housing 1020 for the purpose of ensuring adequate heat dissipation. Similarly, solid electrical contact between the fixture and the respective input and output terminals of the DUT (i.e., gate and drain terminals of the LDMOS device) guarantees a proper signal ground for testing. A cable properly fastened to each ATE connector 1010, 1015 maintains signal integrity by ensuring that the test signal from the signal generator is properly applied to the device input (gate) or device output (drain), as required.

Notably absent from the universal test fixture 1000 are the bulky impedance-matching lumped elements. Instead, two small, unobtrusive one-step impedance transformation elements 1025 (of a dimension just wide enough to accommodate the input and output leads of the device) remain. These two elements only exist on the fixture to correct any impedance mismatch as a result of connectivity. The 50-ohm board-level Z transform functionality is absent from the two one-step impedance transforms, having been de-embedded in ATE software as earlier discussed herein.

Returning to FIG. 8, in step 915, the test engineer establishes connectivity between the universal test fixture and the ATE equipment. This step is optional under the embodiment mentioned above, wherein the universal test fixture is part of the ATE apparatus. Once connectivity is established in step 915, the test engineer makes a software selection according to the device type of the DUT 920. The software selection for a given device type is a simple matter of choosing an option or selecting a file that pairs the input and output S parameter blocks, pre-selected and tuned by the designer, with the specific device type under test.

In one embodiment, the ATE software interface is a graphical interface in which a test engineer makes a software selection by choosing an option, such as by clicking on one or more icons with a pointing device. In other embodiments, the ATE software is implemented as a command-line or menu-driven interface, in which case S parameter block selection would entail manual or auto-loading a separate file into memory, or choosing an option from a menu. In all such embodiments, the goal of software selection at this step is to input the predetermined S parameter blocks for the DUT to the ATE software running on the test engineer's testing station.

In step 925, the device undergoes DC electrical and large signal RF testing at signal frequencies representative of the eventual operating environment envisioned for the product. The large signal RF testing employed preferably pushes the power amplifier into a non-linear operating region, causing the device to generate substantial heat. The universal test fixture should be constructed of material(s) capable of withstanding the resulting heat dissipation by virtue of its construction.

Quality control criteria are applied to the product at step 930, marking the test engineer's ultimate approval or disapproval of a particular DUT' viability, based on results of the testing process. A power amplifier package that fails any one of the battery of DC and RF tests employed will normally be discarded. Thus, the quality control criteria set for a given device run are critical to manufacturability.

Figure 10:
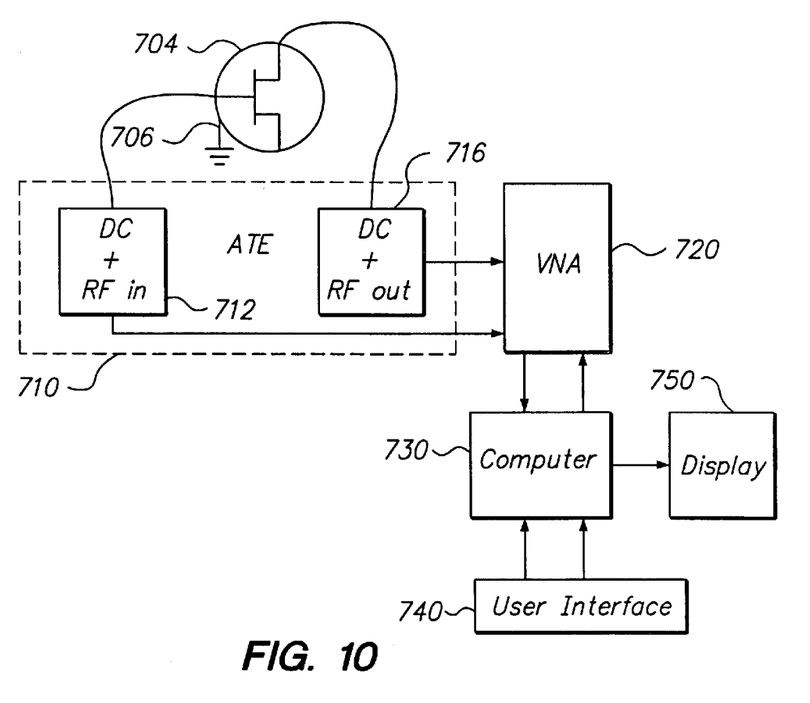
FIG. 10 is a schematic block diagram of a preferred system for performing LDMOS device testing employing virtual fixturing.

FIG. 10 is a schematic block diagram of a preferred LDMOS test system 700 for performing LDMOS device testing using virtual fixturing in accordance with the invention. The test system 700 includes a ATE station 710 having an input probe 712 for coupling to a gate terminal and an output probe 716 for coupling to a drain terminal, respectively, of a LDMOS device 704. Notably, the ground reference (source) is at the back metal of the device being evaluated and is connected to the same ground plane as the test system 700 during the evaluation. A vector network analyzer 720 is coupled to the input and output probes 712 and 716 for measuring one or more performance characteristics, as well as the small signal scatter parameter data, of the LDMOS device 704 using the respective probes.

In a preferred test system, the measured performance characteristics include at least one of output power, gain, input return loss, efficiency, inter-modulation distortion, gain compression, and adjacent channel power. A processor having virtual fixturing software stored thereon (e.g. computer 730) is coupled to the vector network analyzer (VNA) 720 for transforming the measured performance characteristic(s) based on the measured small signal scatter parameters, as described above in conjunction with FIGS. 5 and 6. The system further includes a user interface 740 and display 750 (e.g., for displaying the calibrated performance characteristics of the device 704) to allow for user control and oversight of the testing and evaluation process.

In other embodiments, calibration and fine-tuning of the S parameter blocks may be user-controlled via the virtual fixturing software as loaded and executing on a stand-alone computer workstation, remote terminal, or similar digital computing device or system. In one embodiment, the input and output S parameter blocks are each implemented as individual files in the virtual fixturing software. Other embodiments contemplate that the S parameter blocks are implemented in ROM, or as firmware, or using other known forms of data storage. Further, the apparatus for virtual device fixturing may be embodied as either a turn-key stand-alone system, such as a manufacturing embedded system, or as a modular system wherein a purchaser of the apparatus is able to load the module directly into an existing system, such as a personal computer system.

The invention also eliminates some of the problems of fixture cross-correlation from ATE to ATE. Calibrating the universal test fixture to a particular device type is a simple matter of either making small adjustments to the de-embedded input and output S parameter blocks in software, or selecting a different set of S parameter blocks altogether—parameter blocks suitably pre-programmed for that particular device type. Improving throughput has a direct effect on the cost-effectiveness of semiconductor fabrication. In particular, the greater the number of devices that can be tested per unit time, the greater the chance that device testing will restrict device manufacturability. This reduction or elimination of the final packaging and testing stage as a fabrication bottleneck equates to lower production dollar cost, previously a result of underutilized plant and equipment capacity, idle manpower, and other wasteful production byproducts. Accordingly, improvements made to device manufacturability at the process level directly impact the throughput measure of microchip fabrication on the whole, as gauged by production yield.

While preferred embodiments of the invention have been shown and described in the context of LDMOS power transistor amplifier packages, it will be appreciated by those skilled in the art that the inventive concepts for applying virtual device fixturing in the test process are equally applicable to testing all manner of other transistor devices, e.g., Bi-Polar or MOSFET transistor devices. Accordingly, the invention is not to be restricted, except as set forth in the following claims and their equivalents.

What is claimed:

1. A method for testing a transistor device, comprising:
   measuring small signal scatter parameters of the device;
   measuring a performance characteristic of the device; and
   transforming the measured performance characteristic based on the measured small signal scatter parameters;
   wherein the measured small signal parameters comprise an input reflection coefficient and an output reflection coefficient, and wherein the transformation step is carried out by mapping the input reflection coefficient to one of a predefined set of input impedance equivalents and mapping the output reflection coefficient to one of a predefined set of output impedance equivalents.

2. The method of claim 1, wherein the transformation step is carried out by de-embedding the measured small signal scatter parameters.

3. The method of claim 1, wherein the respective predefined sets of input and output impedance equivalents define a virtual model of an impedance matching network adapted to measure the performance characteristic of the device.

4. The method of claim 1, wherein the respective predefined sets of input and output impedance equivalents are selected as a function of the transistor device being tested.

5. The method of claim 1, wherein the steps of mapping the respective input and output reflection coefficients comprises:
   selecting an input impedance equivalent and an output impedance equivalent as a function of a fundamental frequency of the device.

6. The method of claim 1, wherein the steps of mapping the respective input and output reflection coefficients comprises:
   selecting an input impedance equivalent and an output impedance equivalent as a function of a harmonic of a fundamental frequency of the device.

7. The method of claim 1, wherein the input reflection coefficient, $S_{11}$, and the output reflection coefficient, $S_{22}$, are mapped to the respective input and output impedance equivalents, $Z_{11}$ and $Z_{22}$, according to the relationship:

$$Z_{11} = \frac{Z_o(1+S_{11})(1-S_{22})+S_{12}S_{21}}{(1-S_{11})(1-S_{22})-S_{12}S_{21}}$$

and, $$Z_{22} = \frac{Z_o(1-S_{11})(1+S_{22})+S_{12}S_{21}}{(1-S_{11})(1-S_{22})-S_{12}S_{21}}$$

where $$Z_{11} = \frac{v_1}{i_1}\bigg|_{i_2=0}, \text{ and } Z_{22} = \frac{v_2}{i_2}\bigg|_{i_1=0}$$

in the system $v_1 = Z_{11}i_1 + Z_{12}i_2$, and $v_1 = Z_{21}i_1 + Z_{22}i_2$.

8. The method of claim 1, wherein the performance characteristic comprises one of the following:
output power,
gain,
input return loss,
efficiency,
inter-modulation distortion,
gain compression,
adjacent channel power.

9. The method of claim 1, wherein the device is a LDMOS power transistor.

10. A system for testing a transistor device, comprising:
a test station having an input for coupling to a input terminal and an output for coupling to an output terminal, respectively, of the transistor device;
a network analyzer coupled to the test station for measuring small signal scatter parameters and for measuring a performance characteristic of the device; and
a processor coupled to the network analyzer, the processor configured for transforming the measured performance characteristic based on the measured small signal scatter parameters;
wherein the measured small signal parameters comprise an input reflection coefficient and an output reflection coefficient, and wherein the measured performance characteristic is transformed by mapping the input reflection coefficient to one of a predetermined set of input impedance equivalents and mapping the output reflection coefficient to one of a predefined set of output impedance equivalents.

11. The system of claim 10, wherein the measured performance characteristic is transformed by de-embedding the measured small signal scatter parameters.

12. The system of claim 1, wherein the respective predefined sets of input and output impedance equivalents define a virtual model of an impedance matching network adapted to measure the performance characteristic of the device.

13. The system of claim 1, wherein the respective predefined sets of input and output impedance equivalents are selected as a function of the transistor device being tested.

14. The system of claim 1, wherein the processor maps the respective input and output reflection coefficients by:
selecting an input impedance equivalent and an output impedance equivalent as a function of a fundamental frequency of the device.

15. The system of claim 1, wherein the processor maps the respective input and output reflection coefficients by:
selecting an input impedance equivalent and an output impedance equivalent as a function of a harmonic of a fundamental frequency of the device.

16. The system of claim 13, wherein the input reflection coefficient, $S_{11}$, and the output reflection coefficient, $S_{22}$, are mapped to the respective input and output impedance equivalents, $Z_{11}$ and $Z_{22}$, according to the relationship:

$$Z_{11} = \frac{Z_o(1+S_{11})(1-S_{22})+S_{12}S_{21}}{(1-S_{11})(1-S_{22})-S_{12}S_{21}}$$

and, $$Z_{22} = \frac{Z_o(1-S_{11})(1+S_{22})+S_{12}S_{21}}{(1-S_{11})(1-S_{22})-S_{12}S_{21}}$$

where $$Z_{11} = \frac{v_1}{i_1}\bigg|_{i_2=0}, \text{ and } Z_{22} = \frac{v_2}{i_2}\bigg|_{i_1=0}$$

in the system $v_1 = Z_{11}i_1 + Z_{12}i_2$, and $v_1 = Z_{21}i_1 + Z_{22}i_2$.

17. The system of claim 10, wherein the performance characteristic comprises one of the following:
output power,
gain,
input return loss,
efficiency,
inter-modulation distortion,
gain compression,
adjacent channel power.

18. The system of claim 10, wherein the transistor devices are LDMOS power transistors.

* * * * *

UNITED STATES PATENT AND TRADEMARK OFFICE
CERTIFICATE OF CORRECTION

PATENT NO. : 6,541,993 B2
DATED : April 1, 2003
INVENTOR(S) : Laureanti

It is certified that error appears in the above-identified patent and that said Letters Patent is hereby corrected as shown below:

<u>Column 9,</u>
Line 32, -- an -- should replace the "a" before the word "input";
Line 53, should be corrected to reflect its dependency upon the system of "Claim 10";

<u>Column 10,</u>
Lines 4, 7 and 17, should be corrected to reflect its dependency upon the system of "Claim 10";
Line 12, should be correct to reflect its dependency upon the system of "Claim 10";

Signed and Sealed this

Thirtieth Day of December, 2003

JAMES E. ROGAN
*Director of the United States Patent and Trademark Office*